(12) United States Patent
Kanskar et al.

(10) Patent No.: US 11,211,765 B2
(45) Date of Patent: Dec. 28, 2021

(54) TANDEM PUMPED FIBER AMPLIFIER

(71) Applicant: NLIGHT, INC., Vancouver, WA (US)

(72) Inventors: Manoj Kanskar, Portland, OR (US); Jiamin Zhang, Vancouver, WA (US)

(73) Assignee: NLIGHT, INC., Camas, WA (US)

( * ) Notice: Subject to any disclaimer, the term of this patent is extended or adjusted under 35 U.S.C. 154(b) by 0 days.

(21) Appl. No.: 16/200,462

(22) Filed: Nov. 26, 2018

(65) Prior Publication Data

US 2019/0097377 A1  Mar. 28, 2019

Related U.S. Application Data

(63) Continuation-in-part of application No. 15/782,756, filed on Oct. 12, 2017, now Pat. No. 10,211,591.
(Continued)

(51) Int. Cl.
H01S 3/067 (2006.01)
G02B 6/02 (2006.01)
G02B 6/24 (2006.01)
H01S 5/065 (2006.01)
H01S 3/10 (2006.01)
(Continued)

(52) U.S. Cl.
CPC ...... H01S 3/06758 (2013.01); G02B 6/02042 (2013.01); G02B 6/24 (2013.01); H01S 3/0672 (2013.01); H01S 3/0675 (2013.01); H01S 3/06729 (2013.01); H01S 3/06737 (2013.01); H01S 3/094007 (2013.01);
(Continued)

(58) Field of Classification Search
CPC ........... H01S 3/06758; H01S 3/094007; H01S 3/094042; H01S 3/094053; H01S 3/094096
See application file for complete search history.

(56) References Cited

U.S. PATENT DOCUMENTS 9,134,538 B1  9/2015 Augst et al.
9,136,667 B2  9/2015 Chann et al.
(Continued)

FOREIGN PATENT DOCUMENTS

AU  2009200094 A1  2/2009
CN  102292883  12/2011
(Continued)

OTHER PUBLICATIONS

Engin, "1 kW cw fiber-amplifier with < 0.5 GHz linewidth and near-diffraction limited beam-quality for coherent combining application," Feb. 21, 20011, Proceedings of SPIE 7914, 791407-1-791407-7. (Year: 2011).*
(Continued)

Primary Examiner — Michael Carter
(74) Attorney, Agent, or Firm — Schwabe Williamson & Wyatt

(57) ABSTRACT

In an example, a tandem pumped fiber amplifier may include a seed laser, one or more diode pumps, and a single or plural active core fiber. The single or plural active core fiber may include a first section to operate as an oscillator and a second different section to operate as a power amplifier. The one or more diode pumps may be optically coupled to the first section of the single or plural active core fiber, and the seed laser may be optically coupled to the single active core or an innermost core of the plural active core fiber.

20 Claims, 9 Drawing Sheets

Related U.S. Application Data

(60) Provisional application No. 62/408,046, filed on Oct. 13, 2016.

(51) Int. Cl.
*H01S 3/23* (2006.01)
*H01S 3/094* (2006.01)

(52) U.S. Cl.
CPC .... *H01S 3/094042* (2013.01); *H01S 3/10092* (2013.01); *H01S 3/2308* (2013.01); *H01S 5/0656* (2013.01)

(56) References Cited

U.S. PATENT DOCUMENTS

| | | | |
|---|---|---|---|
| 10,211,591 B2* | 2/2019 | Kanskar | G02B 6/24 |
| 10,374,379 B2 | 8/2019 | Augst | |
| 2002/0008901 A1* | 1/2002 | Kinoshita | H01S 3/302 359/341.1 |
| 2005/0024716 A1 | 2/2005 | Nilsson | |
| 2005/0207455 A1 | 9/2005 | MacCormack | |
| 2006/0187973 A1* | 8/2006 | Varnham | H01S 3/06754 372/6 |
| 2007/0115541 A1 | 5/2007 | Rogers | |
| 2008/0130102 A1* | 6/2008 | Murison | H01S 3/06754 359/341.3 |
| 2010/0202481 A1 | 8/2010 | Morasse et al. | |
| 2011/0249321 A1* | 10/2011 | Savage-Leuchs | G02B 6/02009 359/341.3 |
| 2011/0280581 A1 | 11/2011 | Chann et al. | |
| 2012/0057220 A1 | 3/2012 | Langseth | |
| 2013/0322470 A1 | 12/2013 | Creeden | |
| 2014/0083197 A1* | 3/2014 | Zadok | H04B 10/071 73/800 |
| 2015/0138630 A1* | 5/2015 | Honea | H01S 3/042 359/341.3 |
| 2018/0109064 A1 | 4/2018 | Kanskar | |
| 2018/0145476 A1 | 5/2018 | Price | |
| 2018/0198251 A1 | 7/2018 | Kanskar | |
| 2021/0006029 A1 | 1/2021 | Augst et al. | |

FOREIGN PATENT DOCUMENTS

| | | | |
|---|---|---|---|
| CN | 103560382 A | | 2/2014 |
| CN | 105305211 | | 2/2016 |
| WO | WO2005057737 | * | 6/2005 |
| WO | 2010083595 A1 | | 7/2010 |
| WO | WO2018071712 | | 4/2018 |
| WO | WO2018186920 | | 10/2018 |

OTHER PUBLICATIONS

Flores, "Pseudo-random binary sequence phase modulation for narrow linewidth, kilowatt, monolithic fiber amplifiers," Jul. 28, 2014, Optics Express, vol. 22, No. 15, pp. 17735-17744. (Year: 2014).*

Beier, F. et al.; "6.8 kW Peak Power Quasi-Continuous Wave Tandem-pumped Ytterbium Amplifier at 1071 nm nm" Fiber Lasers XII: Technology Systems and Applications; Proc. of SPIE vol. 9344, 93441H (Mar. 4, 2015); 3 pages.

Zhou, Pu et al.; "High-Power Fiber Lasers Based on Tandem Pumping"; Journal Optical Society of America, vol. 34, No. 3; Mar. 2017; 8 pages.

Naderi, Shadi et al.: "Theoretical Analysis of Effect of Pump and Signal Wavelengths on Modal Instabilities in Yb-doped Fiber Amplifiers"; Proc. of SPIE vol. 8964 8964W-1; (Feb. 20, 2014); 7 pages.

Hu Xiao et al; "High Power 1018 Nmytterbium-Doped fiber Laser and its Application in Tandem Pump"; Applied Optics, vo. 54, No. 27; Sep. 16, 2015; p. 8166.

Christophe A. Codemard et al.; "Tandem Pumping of Large-Core Double-Clad Ytterbium-Doped Fiber for Control of Excess Gain; Lasers, Sources and Related Photonic Devices"; University of Southampton, UK; copyright 2010 Optical Society of America; 3 pages.

Hao Jin-Ping et al.; "Optical Properties of Ytterbium-Doped Tandem-Pumped Fiber Oscillator"; Chinese Physics, Bristol GB; vol. 23, No. 1; Jan. 28, 2014; p. 14203.

Xiao Hu et al.; "Experimental Study on Tandem Pumped Fiber Amplifier"; Optics and Laser Technology, vol. 44, No. 5; copyright 2012 Elsevier Ltd.; 4 pages.

European Patent Office (EPO, Rijswijk, NL); International Search Report and Written Opinion PCT/US2017/056402 dated Feb. 23, 2018; 18 Pages.

European Patent Office; International Search Report and Written Opinion PCT/US2019/062285 dated Mar. 18, 2020; 16 Pages.

European Patent Office; International Search Report and Written Opinion PCT/US2018/013402 dated Nov. 9, 2018; 15 Pages.

Chang You Min et al.; "3% Thermal IJad Measured in Tandem-pumped Yterrbium-doped Fiber Amplifier"; 2014 Conference on Lasers and Electro-Optics (CLEO)—Laser Science Photonic Applications, The Optical Society, Jun. 8, 2014; 2 pages.

Tianfu Yao et al.; "Tandem-pumped ytterbium-doped aluminosilicate fiber amplifer with low quantum defect"; Lasers and Electro-Optics (CLEO), 2012 Conference, ON, IEEE May 6, 2012; 2 pages.

Wang Xuejiao et al.; "First experimental investigation of the amplification of a Yb-doped fiber laser pumped with 1000 and 1014-nm laser diodes", Optical Review, Springer Verlag, Tokyo, JP, vol. 22, No. 5; Jul. 21, 2015, pp. 693-699.

* cited by examiner

TANDEM PUMPED FIBER AMPLIFIER

CROSS REFERENCE TO RELATED APPLICATION

This application is a continuation-in-part of U.S. patent application Ser. No. 15/782,756, filed Oct. 12, 2017, entitled: TANDEM PUMPED FIBER AMPLIFIER, which claims the benefit of U.S. Provisional Application No. 62/408,046, filed Oct. 13, 2016, each of which is incorporated herein by reference in its entirety.

TECHNICAL FIELD

The present disclosure relates to fiber amplifiers.

BACKGROUND

High average power fiber lasers with diffraction-limited beams that are suitable for High Energy Laser (HEL) applications are currently primarily limited in output power by Stimulated Brillouin Scattering (SBS) and Modal Instability. Some known systems have been effective to scale power to greater than the 2 kW level by mitigating SBS. However, Model Instability may still bottleneck power-scaling in regular large-mode area (LMA) fiber, e.g., non-photonic-crystal fiber (PCF) and/or photonic bandgap (PBG) fiber. Specifically, Modal Instability may limit diffraction limited output power to a threshold near 2 kW, such as ~2.2 kW for 20 μm core step-index dual-clad fiber laser.

BRIEF DRAWINGS DESCRIPTION

The accompanying drawings, wherein like reference numerals represent like elements, are incorporated in and constitute a part of this specification and, together with the description, explain the advantages and principles of the presently disclosed technology.

Figure 3A:
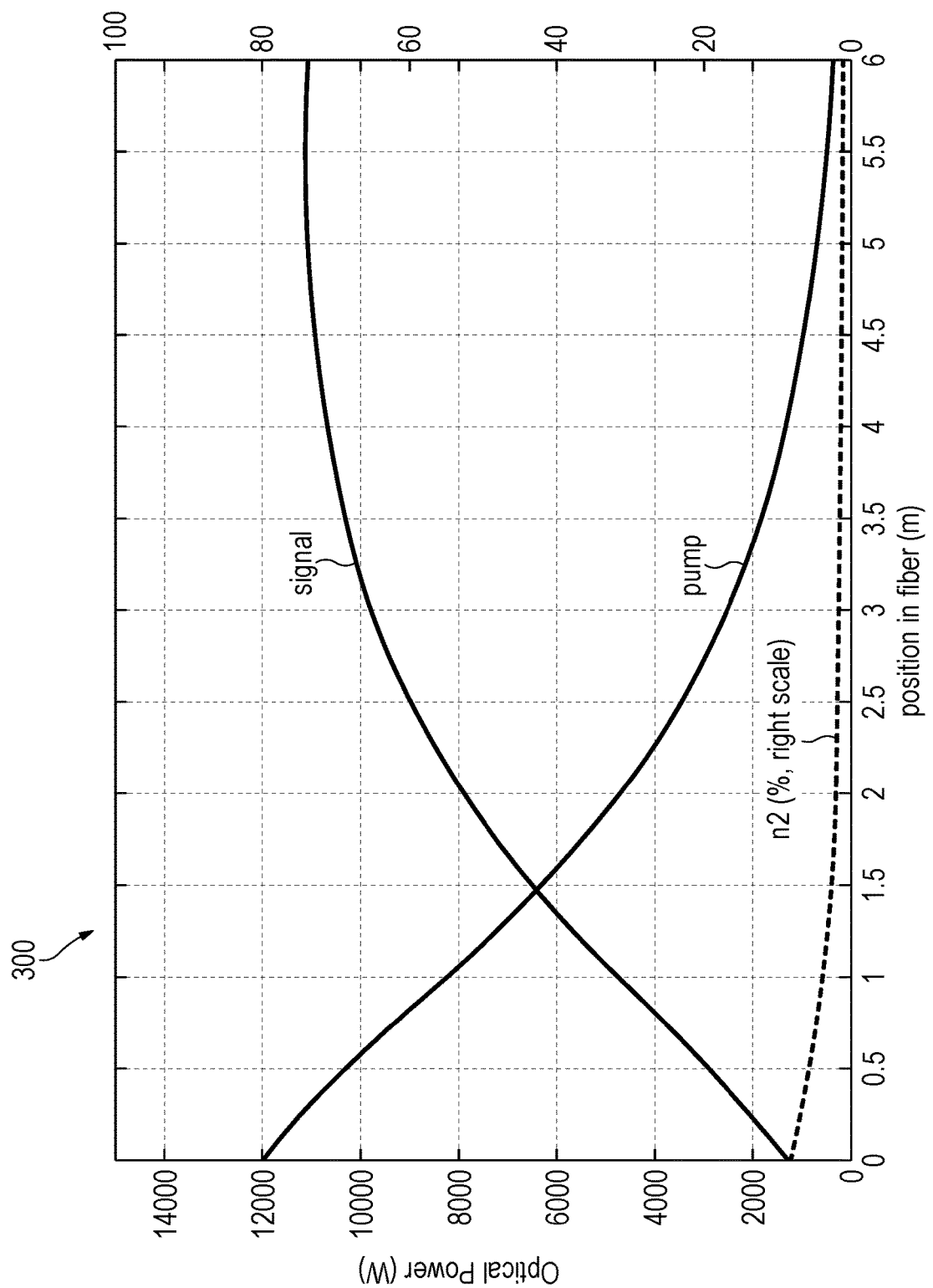
Figure 3B:
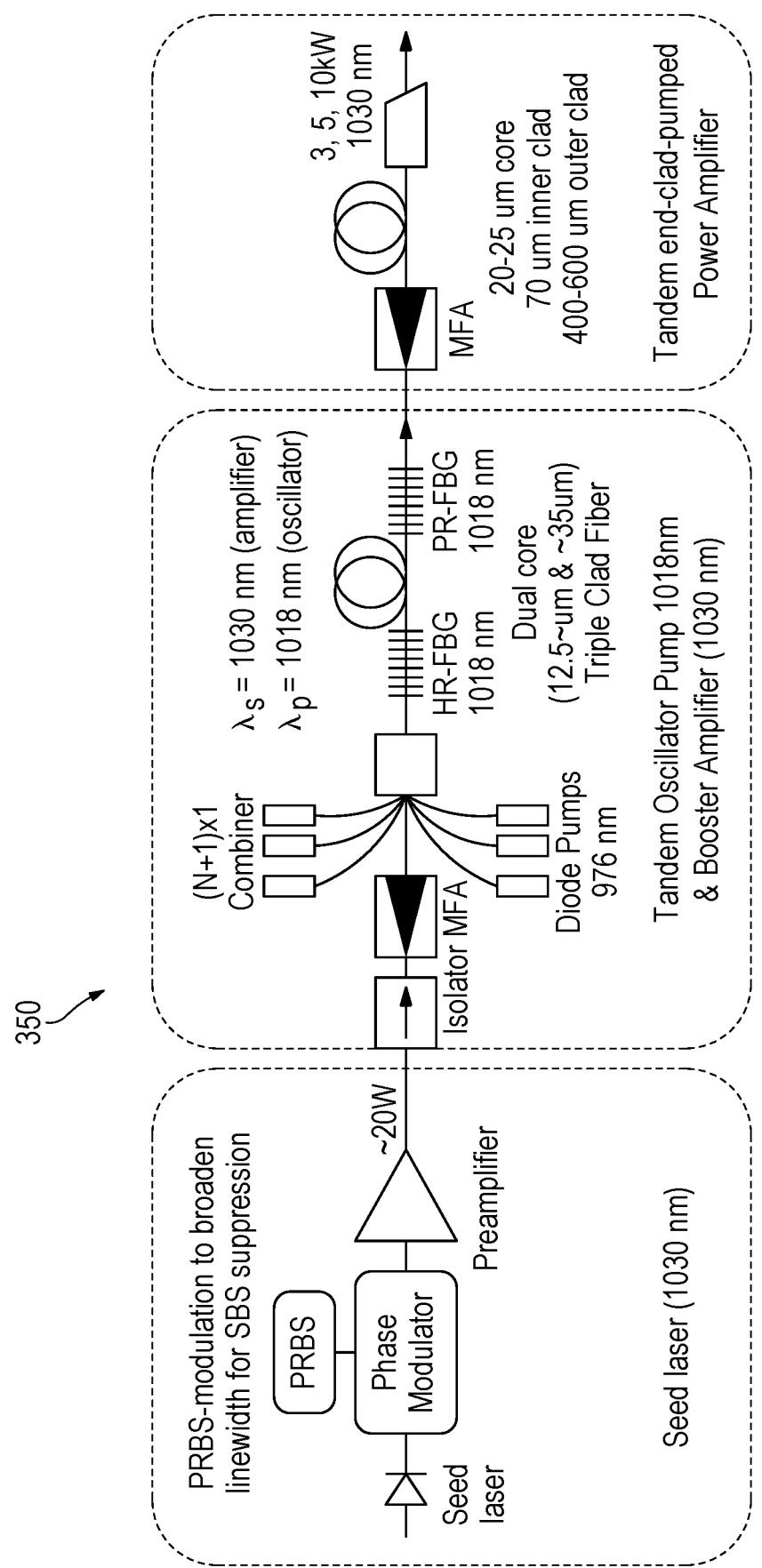
Figure 3C:
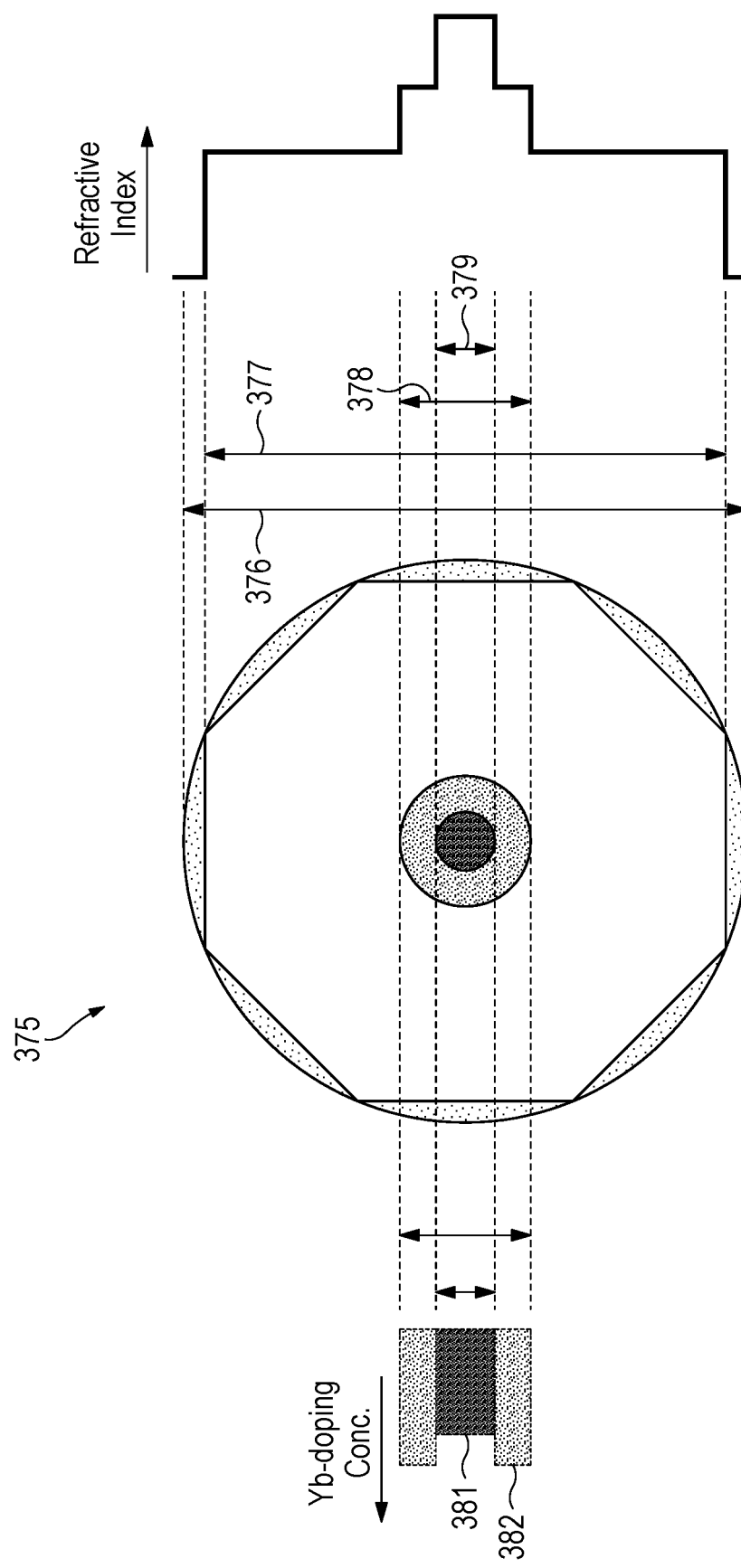

FIGS. 3A-C illustrate, respectively, a graph of calculated signal power and tandem pump power inside a final power amplifier along with upper state population for a tandem pump fiber amplifier, a block diagram of the tandem pump fiber amplifier, and a cross-section view of a dual-core and all-glass-fiber of the tandem pump fiber amplifier.

Figure 4:
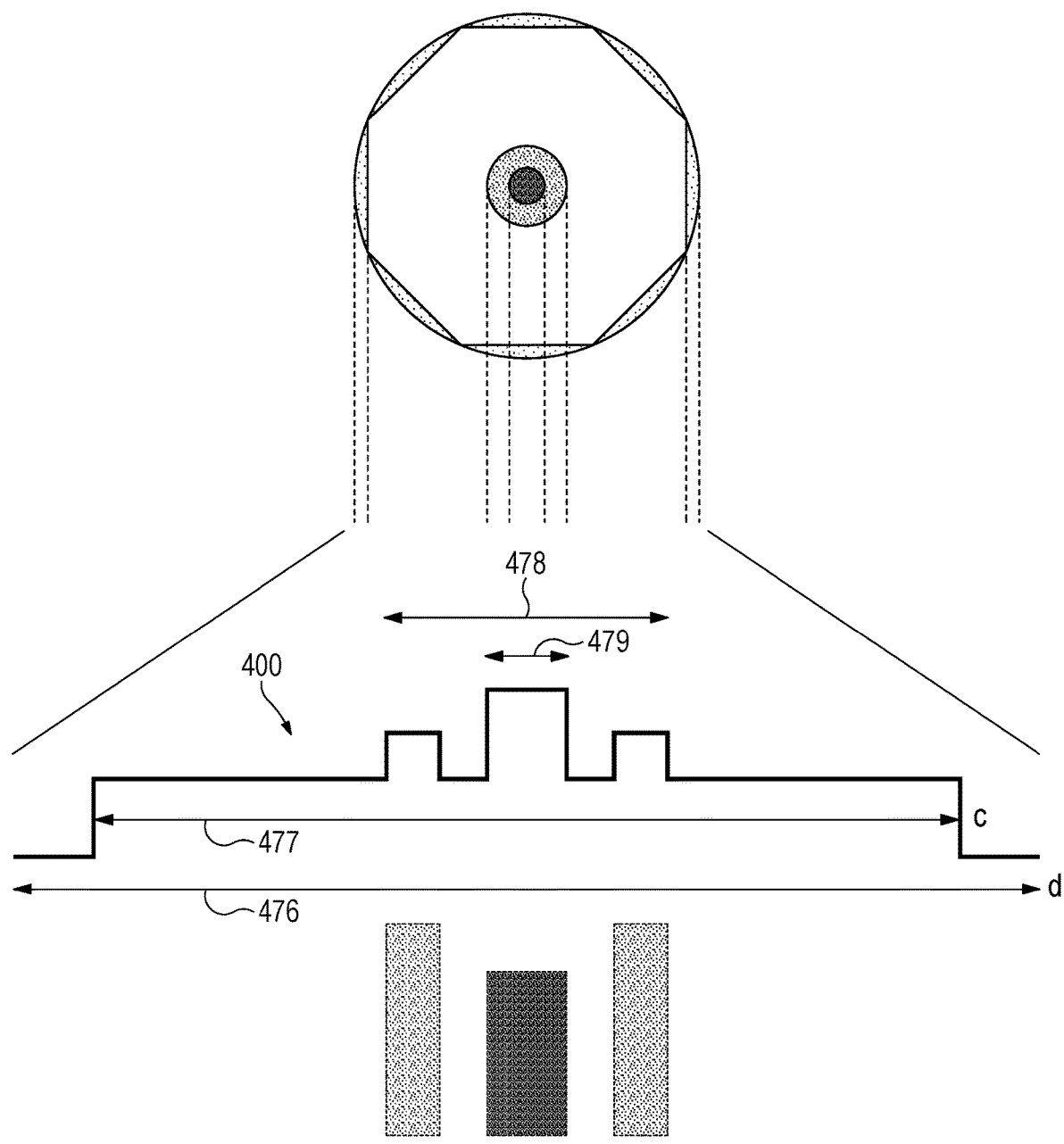

FIG. 4 illustrates a refractive index of a fiber similar to the fiber of FIG. 3C.

Figure 1:
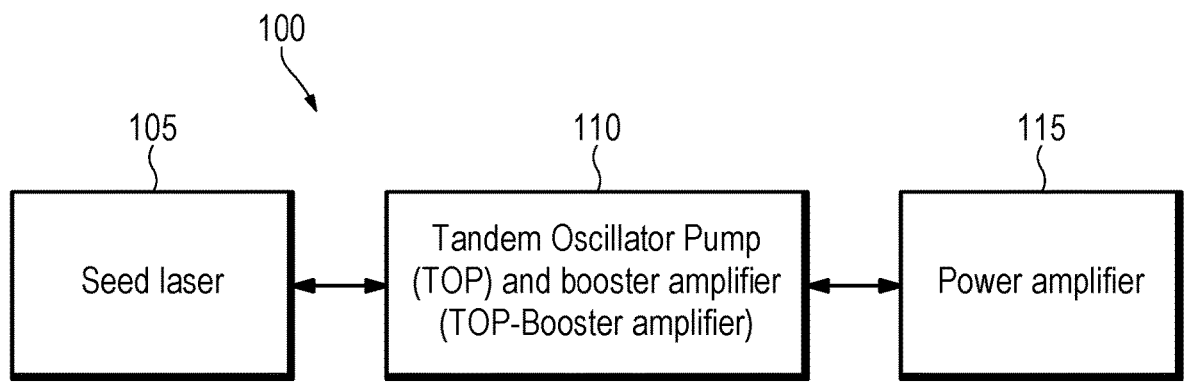
FIG. 1 illustrates a tandem pumped fiber amplifier.
Figure 5:
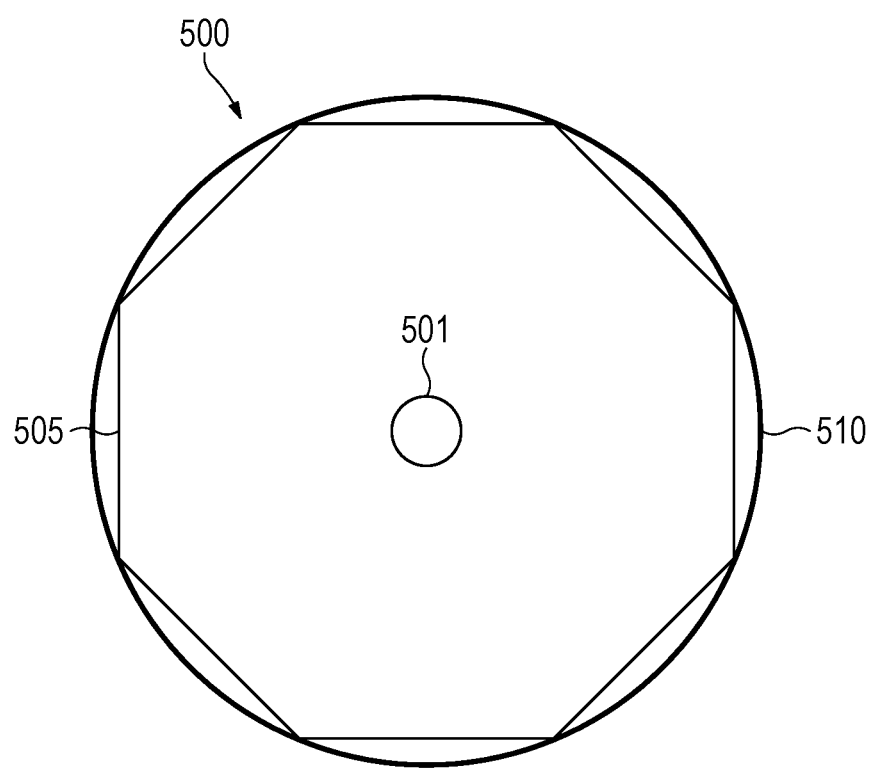

FIG. 5 illustrates a cross-section view of a single active core fiber that may be utilized in the tandem pumped fiber amplifier of FIG. 1, in some embodiments.

Figure 6A:
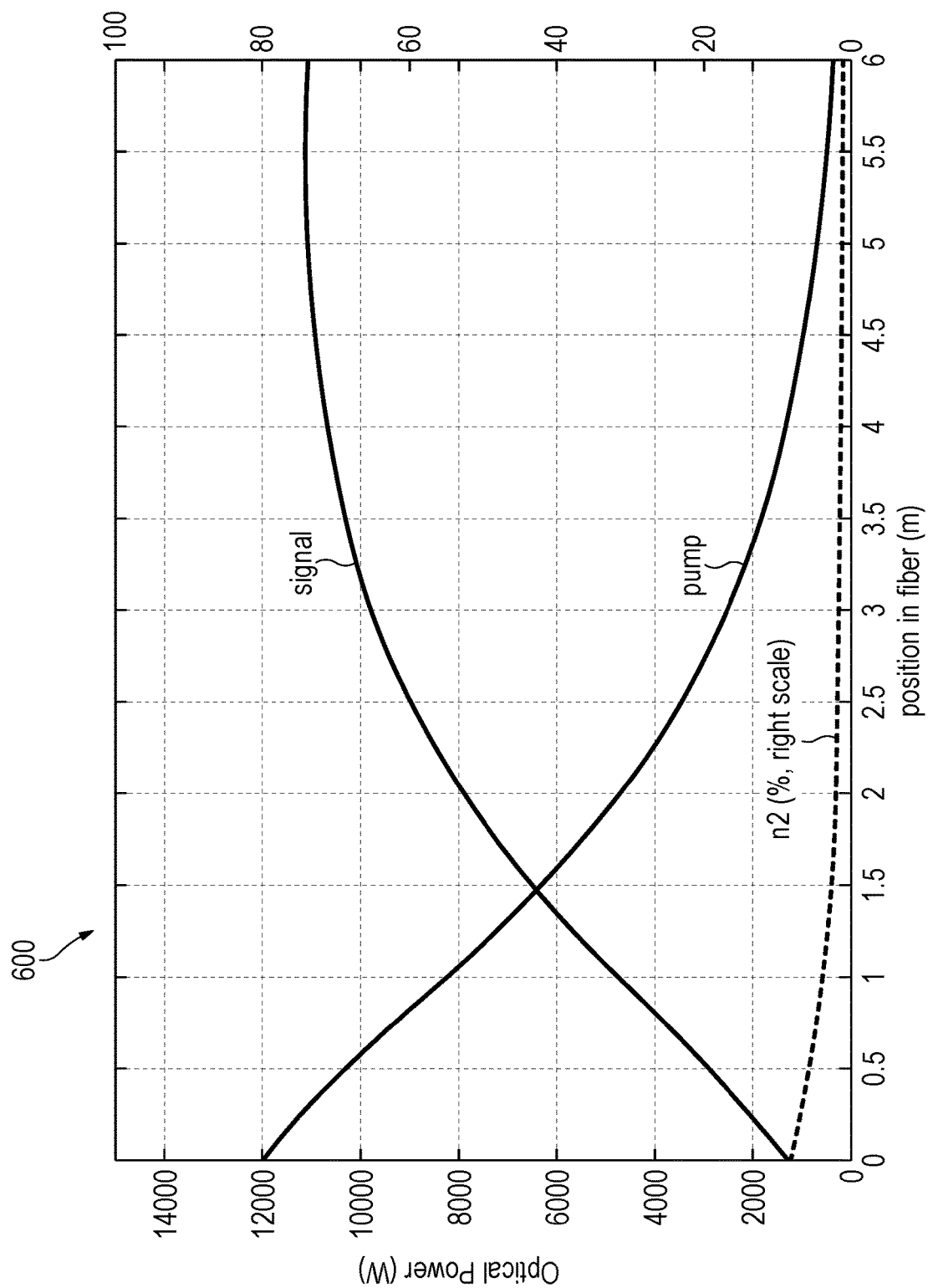
Figure 6B:
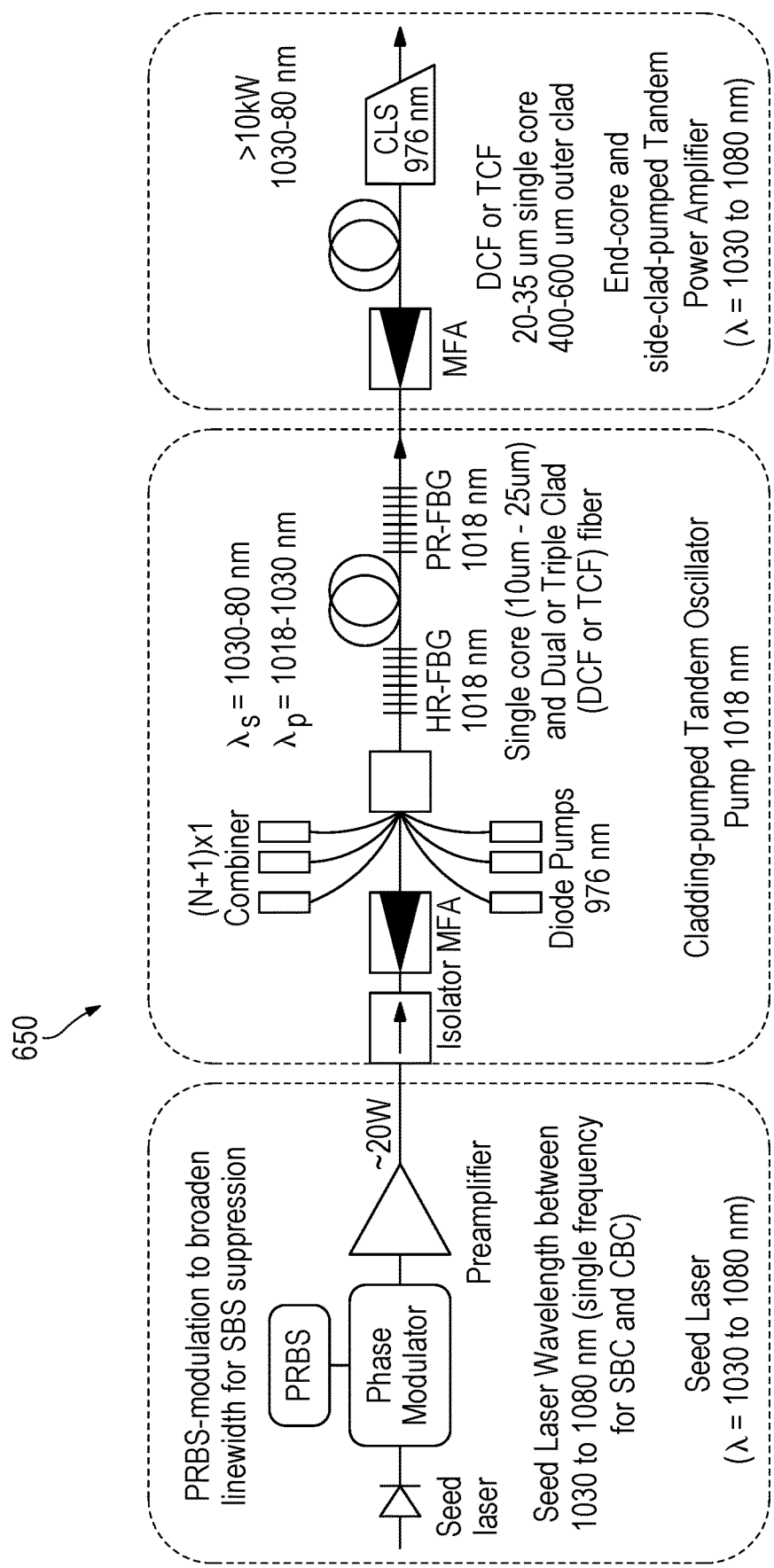
Figure 6C:
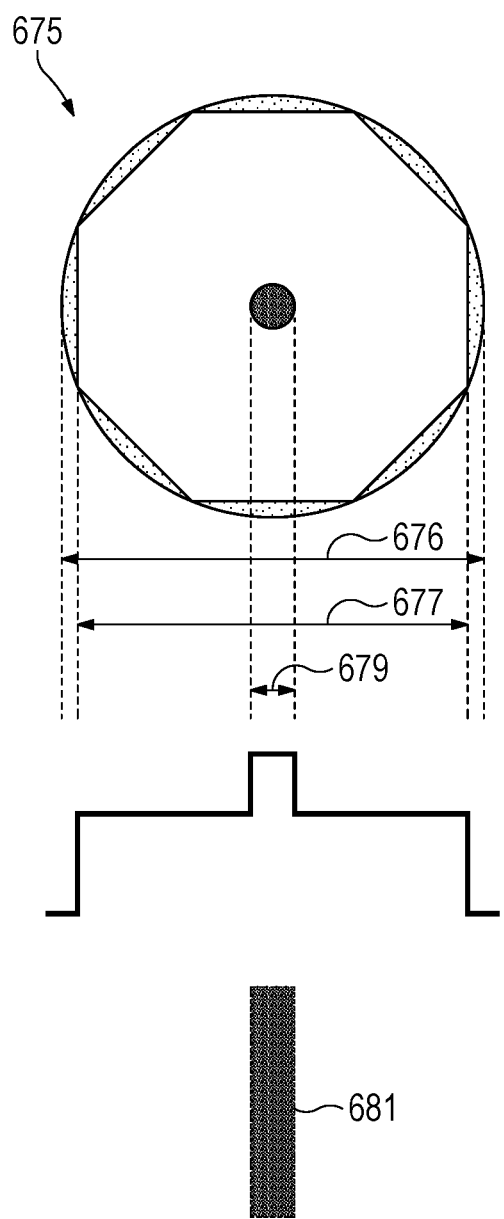

FIGS. 6A-C illustrate, respectively, a graph of calculated signal power and tandem pump power inside a final power amplifier along with upper state population for a tandem pump fiber amplifier, a block diagram of the tandem pump fiber amplifier, and a cross-section view of a single active core and all-glass-fiber of the tandem pump fiber amplifier.

DETAILED DESCRIPTION

Some embodiments of a tandem pumped fiber amplifier may include a seed laser, one or more diode pumps, and a single or plural active core fiber. The single or plural active core fiber may include a first section to operate as an oscillator and a second different section to operate as a power amplifier. The one or more diode pumps may be optically coupled to the first section of the single or plural active core fiber, and the seed laser may be optically coupled to the single active core or an innermost core of the plural active core fiber.

Some embodiments use a single active core oscillator and single active core tandem amplifier (core pumped). Core tandem-pumping may provide relatively high absorption and/or efficiency. As a result, fiber length may be relatively short, which may provide a relatively large margin for deleterious nonlinear effects such as SBS, SRS (stimulated Raman Scattering), FWM (four wave mixing), SPM (self-phase modulation), or the like, or combinations thereof. One embodiment provides a greater than 4 kW single narrow-band fiber amplifier.

Any tandem pumped fiber amplifier described herein may be less bulky (e.g., smaller and/or not as heavy) and/or less costly than a system using a 10 kW single mode fiber laser in a regular LMA fiber using numerous 1018 nm single mode tandem fiber lasers as high brightness pump sources. The tandem pumped fiber amplifiers may have lower power requirements and/or lower thermal dissipation requirements than such systems as well.

Whereas a system using a 10 kW single mode fiber laser in a regular LMA fiber using numerous 1018 nm single mode tandem fiber lasers as high brightness pump sources may require a reduction in quantum-defect heating from the usual ~9% in the 976 nm pumped system down to ~4% in the tandem 1018 nm pumped amplifiers to achieve 10 kW, embodiments disclosed herein may not be subject to the same requirement in order to achieve 10 kW or greater. A system employing a tandem pumped fiber amplifier may be compatible with regular LMA fiber technology but scalable from a few kilowatts to 10 kW or more by scaling up the multimode diode laser pump power. As a result, embodiments described herein may simplify manufacturing in high energy laser applications. In a system employing a tandem pumped fiber amplifier, a final amplifier stage may be greater than 1 kW to address Model Instability. A tandem pumped fiber amplifier may push the single channel output power to greater than known thresholds created by Modality Instability, such as 3 kW, 5 kW, 10 kW, or more.

Several advantages of this approach have been identified. First, the quantum defect in the power amplifier may be only 1.5% at 1030 nm when pumped at 1018 nm, in some embodiments. At a nominal wavelength of 1064 nm, this quantum defect is about 4%. Which is less than half compared to pumping at 976 nm (which may be associated with a 8.4% quantum defect). Secondly, the signal injected into the power amplifier may be significantly greater than 0.1 kW. Both factors may provide a higher threshold condition for Modal Instability. This may provide greater than 10 kW of spectral beam combining (SBC) and coherent beam combining (CBC) combinable power. The tandem pumped fiber amplifier may use regular LMA fiber technology without compromising the total efficiency of the system. All of this can be achieved by pumping with low SWAP (size, weight and power) and low-cost multimode diode pumps rather than using a multitude of expensive and bulky single mode fiber lasers.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum." or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

FIG. 1 illustrates a tandem pumped fiber amplifier 100. The tandem pumped fiber amplifier 100 may include a seed laser 105 with a selected center wavelength that may be pseudo random bit sequence (PRBS) phase-modulated to achieve necessary bandwidth to suppress SBS and keep coherence length long enough for SBC and CBC applications. The selected center wavelength may be in the range of 1020-1080 nm for Yb-doped fiber, in some embodiments. The seed laser 105 may include a preamplifier (not shown) to generate sufficient power, e.g., greater than 20 W of seed power for amplification in the subsequent sections.

Fiber of the seed laser 105 may be coupled to (e.g., spliced) with fiber of a tandem oscillator pump and booster amplifier (TOP-booster amplifier) 110, which may be coupled to (e.g., spliced) with fiber of a power amplifier 115. The TOP-booster amplifier 110 may include a first section of a single or plural active core fiber (e.g., a dual active core fiber), and at least one set of one or more diode pumps optically coupled, e.g., end-coupled, side-coupled, or the like, or combinations thereof, to the diode pump set.

Figure 2:
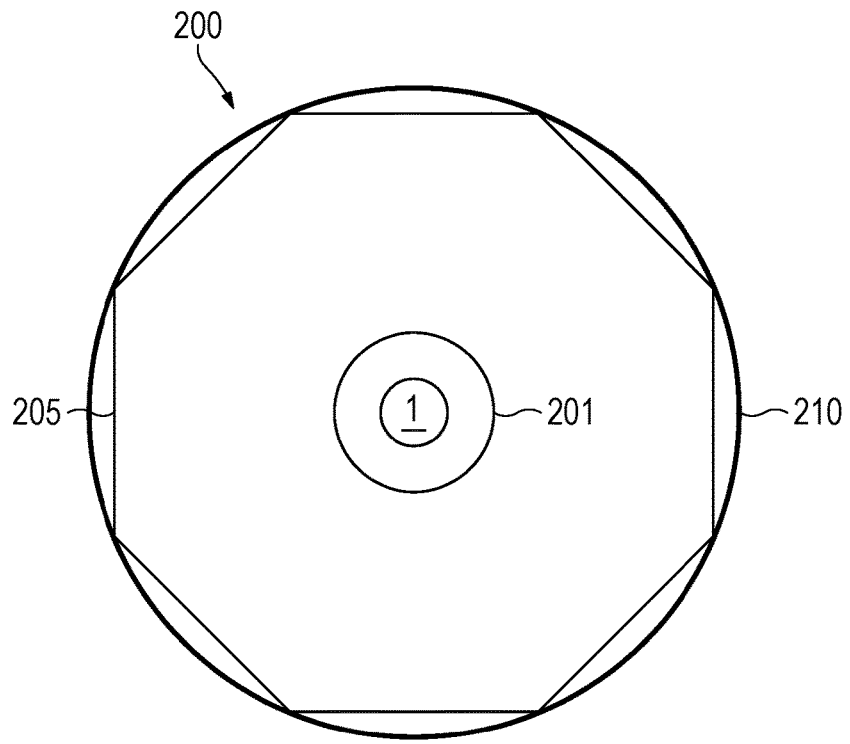
FIG. 2 illustrates a cross-section view of a coaxial dual active core fiber that may be utilized in a tandem pumped fiber amplifier, in some embodiments.

In a plural active core example, some the cores of the plural active core fiber (e.g., both of the cores of a dual active core fiber laser) may be arranged along a same axis or a different axis (e.g., coaxial with the second core symmetrically surrounding the first core or with the second core asymmetrically surrounding the first core). FIG. 2 illustrates a cross-section view of a coaxial-type dual active core fiber 200 that may be utilized in the tandem pumped fiber amplifier 100 of FIG. 1, in some embodiments. FIG. 5 illustrates a cross-section view of a single active core fiber 500 that may be utilized in the tandem pumped fiber amplifier 100 of FIG. 1, in some embodiments.

Referring now to FIG. 2, the coaxial-type dual active core fiber 200 includes a first core 1 surrounded by a second core 201. In some embodiments, the first core 1 may have a first diameter, and the second core 201 may have a second different diameter (e.g., a second larger diameter). In one embodiment, the first diameter may be ~12.5 µm and the second diameter may be ~35 µm.

The first core 1 may be doped differently than the second core 201. In one embodiment, the first core 1 may include a first doping concentration and the second core 201 may include a second doping concentration associated with a higher absorption coefficient. In some embodiments, the first core 1 may include Yb-700 (Yb ~50×10$^{24}$ m$^{-3}$) and the second core 201 may include with Yb-1200 (Yb ~120×10$^{24}$ m$^{-3}$).

In some examples, the first core 1 may have a numerical aperture (NA) that is not greater than an NA of the second core 201. In one embodiment, the first core 1 may have an NA of about 0.05 or less and the second core 201 may have an NA no less than 0.05, e.g., in the range of 0.05-0.10.

The fiber 200 may include a cladding 205 surrounding the cores 1 and 201, and a jacket 210. The cladding 205 may be a glass-clad multimode pump guiding octagonal core with a third diameter that is greater than the second diameter of the second core, e.g., ~800 µm.

Referring now to FIG. 5, the single active core fiber 500 may include a first section (110. FIG. 1) and a second section (115, FIG. 1). The first section 110 may include a core 501 having a diameter of ~10-12 µm. The core 501 of this section 110 may be doped with Yb-700 (Yb ~50×10$^{-1}$ m$^{-3}$). The core 501 of this section 110 may have an NA of about 0.05 (in one embodiment, 0.07).

The fiber 500 in the first section 110 may include a cladding 505 surrounding the core 501, and a jacket 510. The cladding 505 and the jacket 510 may be similar to any cladding or jacket described herein. The cladding 505 may be a glass-clad multimode pump guiding octagonal core with a diameter that is greater than the diameter of the core 501, e.g., ~800 µm. The second section 115 may include a core 501 having a diameter of ~17-35 µm. The core 501 of this section 115 may be doped with Yb-700 (Yb ~50×10$^{24}$ m$^{-3}$) and/or with a doping profile of 80-85% confined doping. The core 501 of this section 115 may have an NA of about 0.05 (in one embodiment, 0.07). The fiber 500 in the second section 115 may have a similar cladding 505 and jacket 510 as in the first section 110.

Referring again to FIG. 1, the TOP booster-amplifier 110 may include the first section of the single or plural active core fiber. The first section may include a first fiber Bragg grating (FBG) and a second FBG (e.g., an HR (highly reflective) FBG and a PR (partially reflecting) FBG, respectively), which may include diameters corresponding to core structure, e.g., the second core 201 (FIG. 2) or the core 501 (FIG. 5). The first and second FBGs may be centered at a selected wavelength to form a multi-mode oscillator which builds up necessary power for the tandem pump to be used by the power amplifier 115.

The selected wavelength may be less than a center wavelength of the seed laser. A difference may be 3% or less (e.g., 2.3%) in some examples and/or in a range of 0.1-6%. In this range, with a core structure having sufficient dimensions to suppress Modal Instability, and SBS. The selected wavelength may be in the range of 1010-1045 nm (e.g., 1018 nm), in one embodiment.

In some examples, the doping of the first core 1 (FIG. 2) or the core 501 (FIG. 5) may be selected to generate only sufficient single mode seed power while it is bi-chromatically pumped by both the multimode 976 nm pump as well as the 1018 nm tandem pump (which may be generated within the core structure). The oscillator of the first section of the single or plural active core fiber may use the doped core structure to convert most of the 976 nm multi-mode pump power into 1018 nm wavelength within the core structure. Residual unabsorbed 976 nm pump (e.g., several percent) may enter the cladding of the second section of the single or plural active core fiber (e.g., the power amplifier 115) and be utilized, which may optimize overall efficiency (e.g., overall electrical-to-optical power conversion efficiency). An o-o efficiency corresponding to the first section may be 3% more efficient due to lower quantum defect when generating 1018 nm wavelength compared to 1064 nm amplifiers.

FIGS. 3A-C (dual active core embodiment) illustrate, respectively, a graph 300 (FIG. 3A) of calculated signal power and tandem pump power inside a final power amplifier along with upper state population for a tandem pump fiber amplifier 350 (FIG. 3B), a block diagram of the tandem pump fiber amplifier 350, and a cross-section view of a dual-core and all-glass-fiber 375 (FIG. 3C) of the tandem pump fiber amplifier 350. FIGS. 6A-C (single active core embodiment) illustrate, respectively, a graph 600 (FIG. 6A) of calculated signal power and tandem pump power inside a final power amplifier along with upper state population for a tandem pump fiber amplifier 650 (FIG. 6B), a block diagram of the tandem pump fiber amplifier 650, and a cross-section view of a single active core and all-glass-fiber 675 (FIG. 6C) of the tandem pump fiber amplifier 650.

Modeling of the tandem pump fiber amplifier 350 (FIG. 3B) has shown an absorption of greater than 0.51 dB (of 976 nm and 1018 nm) and greater than 15 dB (of 976 nm) in the second core. When the longest signal wavelength of 1080 nm at 20 W is launched into a first section of the fiber 375, greater than 1.27 kW of signal may be generated which can be amplified in the second section of the fiber 375. Modeling of the plural active core embodiment of FIGS. 3A-C predicts greater than 83% conversion efficiency for the 976 nm multimode pump into a 1018 nm tandem pump, and power levels of greater than 12.5 kW may be generated in the second core of the fiber 375 given a 10-meter-long oscillator. Results of this simulation are shown in the graph 300.

Modeling of the tandem pump fiber amplifier 650 (FIG. 6B) has shown similar results. In a ~8 meter "effective" fiber length, a core with Yb-700 may achieve absorption of greater than 0.51 dB (of 976 nm and 1018 nm) and greater than 15 dB (of 976 nm) in the core. However, when the longest signal wavelength of 1080 nm at 20 W is launched into a first section of the fiber 375, greater than 10 kW of signal may be generated which can be amplified in the second section of the fiber 675. Modeling of the single active core embodiment of FIGS. 6A-C predicts greater than 83% conversion efficiency for the 976 nm multimode pump into a 1018 nm tandem pump, and power levels of greater than 12.5 kW may be generated in the core of the fiber 675 given a 10-meter-long oscillator and Yb-1200 doping. Results of this simulation are shown in the graph 600.

Referring now to FIGS. 3A-C, FIG. 3C shows a refractive index of the first core, the second core, the inner glass clad, as well as relative doping concentration in the cores. In this embodiment, the values 376-379 may be, respectively, 880 μm, 800 μm, 35 μm, and 12.5 μm, and the core region 381 may include a first doping profile of Yb-700 ~50×10$^{24}$ m$^{-3}$ and the core region 382 may include a second different profile of Yb-1200 ~120×10$^{24}$ m$^{-3}$. In other embodiments, the values 376-379 may be, respectively, 880 μm, 800 μm, 35 μm, and 14 μm. FIG. 6C shows a refractive index of the core, the inner glass clad, as well as doping concentration in the core. In this embodiment, the values 676, 677, and 679 may be, respectively, 660-880 μm, 600-800 μm, and 10-12 μm (oscillator fiber)/17-35 μm (power amplifier fiber), and the core region 681 may include a doping profile of Yb-700 ~50×10$^{24}$ m$^{-3}$ (oscillator fiber and/or power amplifier fiber) or 80-85% confined doping in the core of the power amplifier fiber.

The seed laser of any tandem pump fiber amplifier described herein may be, for SBC or CBC, a single-mode semiconductor laser such as a distributed feedback (DFB) laser or a non-planar ring oscillator (NPRO) and phase modulated to suppress SBS (for other applications any appropriate single mode seed, e.g., any 20 W single mode seed, may be used). The seed laser may be 1064 nm.

A TOP boost amplifier of the tandem pump fiber amplifier 350 (FIG. 3B) may include a dual active core and a plural clad, e.g., dual or triple clad. The inner core may be doped to generate sufficient power at seed wavelength need to enter the power amplifier stage. The outer multimode core may be doped to convert a portion (e.g., most) of the 976 nm diode pump into the 1018 nm tandem pump. The tandem oscillator pump may use HR and PR FBG's to generate a ~10 nm bandwidth multi-mode oscillator using a combination of the inner and outer cores, which may be doped at the same level or differently. HR and PR FBG's may have the same core diameter as the outer multimode core of the TOP-booster gain amplifier. The seed wavelength that is injected into this stage may be amplified by both the 976 nm multimode pump as well as the 1018 nm tandem pump that is generated inside the oscillator cavity, e.g., with different absorption coefficient determined by the rare earth dopant absorption cross section at these wavelengths and the core-to-clad area ratios. The power scaling of this laser may be done by adding more diode pumps as needed to reach target power values, e.g., 3 kW, 5 kW, 10 kW, etc. In some embodiments, the "effective multimode HR-FBG" may be one of the following types:

1. FBG written in Ge-doped fiber with a core diameter equal to 379 (FIG. 3C) or 479 (FIG. 4).
2. FBG written in Ge-doped fiber with a core diameter equal to 379 (FIG. 3C) or 479 (FIG. 4) and spliced to a passive chirally-coupled core fiber of the same core size so as to strip off the higher order modes so that reflectivity of the FBG is greater than 99%.
3. FBG written in grated-index (GRIN) fiber with an "effective core diameter" equal to 379 (FIG. 3C) or 479 (FIG. 4).
4. FBG written in GRIN fiber with an "effective core diameter" equal to 379 (FIG. 3C) or 479 (FIG. 4) and spliced to a passive chirally-coupled fiber of the same core size so as to strip off the higher order modes so that reflectivity of the FBG is greater than 99%.
5. FBG written in a multimode fiber with rings of alternating high-index and low index shells.
6. The seed wavelength that is injected into this stage may be amplified by both the 976 nm multimode pump as well as the 1018 nm tandem pump that is generated inside the oscillator cavity, e.g., with different absorption coefficient determined by the rare earth dopant absorption cross section at these wavelengths and the core-to-clad area ratios. The power scaling of this laser may be done by adding more diode pumps as needed to reach target power values, e.g., 3 kW, 5 kW, 10 kW, etc.

The final power amplifier of the tandem pump fiber amplifier 350 may use all of the 1018 nm tandem pump in the inner cladding and a portion (e.g., all) any residual 976 nm light not absorbed in the oscillator but guided in the outer clad to amplify seed wavelength and mode-field-adaptor may be used to match the single mode beam in the TOP-booster fiber and the final power amplifier. Some embodiments may use a cladding light stripper (CLS) to strip off the residual 976 nm pump before the output endcap.

Some embodiments include a plural active core fiber in a ~6 meter "effective" fiber length including a Yb-doped core region, an undoped inner clad region, and an outer clad region (e.g., an outer glass-clad). In one embodiment, the dimensions of the doped core region, the undoped inner clad region, and the outer clad region may be 20-25 µm, 70 µm, and 400-600 µm, respectively (pump guide may be 800 µm). The plural active core fiber may include a final power amplifier including a mode-field adaptor to match the mode to a power amplifier section of the plural active core fiber. A 1018 nm tandem pump may be guided in the inner clad region and may pump the signal in the innermost core of the plural active core fiber.

FIG. 4 illustrates a refractive index 400 of a fiber that is similar to the fiber 375 of FIG. 3C and includes a dual active core triple fiber clad. In this example, the values 476-479 are, respectively, 660-880 µm, 600-800 µm/0.022 NA or higher, ~35 µm (Yb-1200 doped annulus/0.05 NA), ~10 µm (Yb-700 doped/0.065 NA).

Referring now to FIGS. 6A-C, a tandem oscillator pump and booster amplifier (TOP-booster amplifier) may include a core (10 µm and 25 µm) and a plural clad (e.g., DCF or TCF). For a seed wavelength of 1030-1080 nm, the pump wavelength may be 1018-1030 nm. The TOP-booster amplifier may be coupled to (e.g., spliced) with fiber of a power amplifier. The power amplifier may include a core (20-35 µm) and a plural clad (e.g., DCF or TCF). An outer clad may be 400-600 µm. In some embodiments, the power amplifier comprises an end-core & side-clad-pumped tandem power amplifier with a wavelength of 1030 to 1080 nm. The power scaling of this laser may be done by adding more diode pumps as needed to reach target power values, e.g., greater than 10 kW.

The final power amplifier of the tandem pump fiber amplifier 650 may use all of the 1018 nm tandem pump in the inner cladding and a portion (e.g., all) any residual 976 nm light not absorbed in the oscillator but guided in the outer clad to amplify seed wavelength and mode-field-adaptor may be used to match the single mode beam in the TOP-booster fiber and the final power amplifier. Some embodiments may use a cladding light stripper (CLS) to strip off the residual 976 nm pump before the output endcap.

In view of the many possible embodiments to which the principles of the disclosed technology may be applied, it should be recognized that the illustrated embodiments are only preferred examples and should not be taken as limiting the scope of the disclosure. I claim as my invention all that comes within the scope and spirit of the appended claims.

The invention claimed is:

1. A tandem pumped fiber amplifier for high energy laser (HEL) applications, the tandem pumped fiber amplifier comprising:
   an optical fiber including at least one core, wherein a seed laser is optically coupled to the at least one core;
   the optical fiber including a first section to operate as an oscillator and a second different section to operate as a power amplifier; and
   one or more diode pumps optically coupled to the first section of the optical fiber,
   wherein the at least one core of the first section is doped to convert the one or more diode pumps into a tandem pump, wherein the one or more diode pumps and the tandem pump bi-chromatically pump the power amplifier;
   wherein a selected wavelength associated with the oscillator is less than a center wavelength of the seed laser, wherein the at least one core is dimensioned to suppress modal instability at 2 kW or greater output power when a difference between the selected wavelength and the center wavelength is in a range of 0.1-8% and a single active core is employed, wherein a core-to-cladding area ratio is uniform through the entire length of the second different section.

2. The tandem pumped fiber amplifier of claim 1, wherein a center wavelength of the seed laser is in a range of 1020-1080 nm.

3. The tandem pumped fiber amplifier of claim 1, wherein the selected wavelength is in the range of 1010-1045 nm.

4. The tandem pumped fiber amplifier of claim 1, wherein the oscillator comprises a single mode or multimode oscillator.

5. The tandem pumped fiber amplifier of claim 1, wherein the one or more diode pumps comprise a set of diode pumps, and the tandem pumped fiber amplifier further comprises:
   a combiner optically coupled between the set of diode pumps and the first section of the optical fiber.

6. The tandem pumped fiber amplifier of claim 1, wherein the seed laser comprises a preamplifier to generate greater than 20 w of seed power.

7. The tandem pumped fiber amplifier of claim 1, wherein the seed laser includes a phase modulator and employs pseudo random bit sequence (PRBS) phase-modulation.

8. The tandem pumped fiber amplifier of claim 1, wherein the first section includes a highly reflective fiber Bragg grating (HR-FBG) and partially reflecting fiber Bragg grating (PR-FBG) associated with the oscillator.

9. The tandem pumped fiber amplifier of claim 1, wherein a final amplifier stage of the single active core includes a mode-field-adaptor to match the final amplifier stage to a mode corresponding to the oscillator.

10. The tandem pumped fiber amplifier of claim 1, wherein a diameter of the core on one boundary of boundaries of the second different section is the same as a diameter of the core on the other boundary of the boundaries of the second different section.

11. A tandem pumped fiber amplifier for high energy laser (HEL) applications, comprising:
   a seed laser optically coupled to a core of an optical fiber;
   the optical fiber including a first section to operate as an oscillator and a second different section to operate as a power amplifier; and
   one or more diode pumps optically coupled to the first section of the optical fiber, wherein the core is doped to convert the one or more diode pumps into a tandem pump, wherein the one or more diode pumps and the tandem pump bi-chromatically pump the power amplifier;
   wherein a selected wavelength associated with the oscillator is less than a center wavelength of the seed laser, wherein the core is dimensioned to suppress modal instability at 2 kW or greater output power when a difference between the selected wavelength and the center wavelength is in a range of 0.1-8% and single active core is employed, wherein a diameter of the core on one boundary of boundaries of the second different section is the same as a diameter of the core on the other boundary of the boundaries of the second different section.

12. The tandem pumped fiber amplifier of claim 11, wherein a center wavelength of the seed laser is in a range of 1020-1080 nm.

13. The tandem pumped fiber amplifier of claim 11, wherein the selected wavelength is in the range of 1010-1045 nm.

14. The tandem pumped fiber amplifier of claim 11, wherein the oscillator comprises a single mode or multi-mode oscillator.

15. The tandem pumped fiber amplifier of claim 11, wherein the one or more diode pumps comprise a set of diode pumps, and the tandem pumped fiber amplifier further comprises:

a combiner optically coupled between the set of diode pumps and the first section of the optical fiber.

16. The tandem pumped fiber amplifier of claim 11, wherein the seed laser comprises a preamplifier to generate greater than 20 w of seed power.

17. The tandem pumped fiber amplifier of claim 11, wherein the seed laser includes a phase modulator and employs pseudo random bit sequence (PRBS) phase-modulation.

18. The tandem pumped fiber amplifier of claim 11, wherein the first section includes a highly reflective fiber Bragg grating (HR-FBG) and partially reflecting fiber Bragg grating (PR-FBG) associated with the oscillator.

19. The tandem pumped fiber amplifier of claim 11, wherein a final amplifier stage of the single active core includes a mode-field-adaptor to match the final amplifier stage to a mode corresponding to the oscillator.

20. The tandem pumped fiber amplifier of claim 11, wherein a core-to-cladding area ratio is uniform through the entire length of the second different section.

* * * * *